United States Patent
Uzawa (10) Patent No.: US 6,271,910 B1
(45) Date of Patent: *Aug. 7, 2001

(54) PROJECTION EXPOSURE APPARATUS AND METHOD

(75) Inventor: Shigeyuki Uzawa, Naka-machi (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/914,880

(22) Filed: Aug. 20, 1997

(30) Foreign Application Priority Data

Aug. 23, 1996 (JP) .................................................. 8-240022

(51) Int. Cl.[7] ........................... G03B 27/52; G03B 27/42; G01B 11/00

(52) U.S. Cl. ................................. 355/55; 355/53; 355/77; 356/401

(58) Field of Search ................................ 355/52, 53, 67, 355/77; 356/399, 400, 401; 250/548

(56) References Cited

U.S. PATENT DOCUMENTS

| | | |
|---|---|---|
| 5,008,703 | 4/1991 | Kawakami et al. . |
| 5,063,582 | 11/1991 | Mori et al. . |
| 5,112,133 | 5/1992 | Kurosawa et al. . |
| 5,131,022 | 7/1992 | Terashima et al. . |
| 5,142,156 | 8/1992 | Ozawa et al. . |
| 5,150,391 | 9/1992 | Ebinuma et al. . |
| 5,157,700 | 10/1992 | Kurosawa et al. . |
| 5,172,402 | 12/1992 | Mizusawa et al. . |
| 5,182,615 | 1/1993 | Kurosawa et al. . |
| 5,184,176 * | 2/1993 | Unno et al. ............................. 355/52 |
| 5,231,291 | 7/1993 | Amemiya et al. . |
| 5,285,488 | 2/1994 | Watanabe et al. . |
| 5,317,615 | 5/1994 | Ebinuma et al. . |
| 5,377,251 | 12/1994 | Mizusawa et al. . |
| 5,499,099 | 3/1996 | Sato et al. . |
| 5,543,921 | 8/1996 | Uzawa et al. . |
| 5,581,324 * | 12/1996 | Miyai et al. ............................ 355/53 |
| 5,585,925 | 12/1996 | Sato et al. . |
| 5,646,413 * | 7/1997 | Nishi ..................................... 250/548 |
| 5,695,897 | 12/1997 | Mitome et al. . |
| 5,781,277 * | 7/1998 | Iwamoto ................................ 355/53 |

* cited by examiner

*Primary Examiner*—Russell Adams
*Assistant Examiner*—Peter B. Kim
(74) *Attorney, Agent, or Firm*—Fitzpatrick, Cella, Harper & Scinto (57) ABSTRACT

An exposure apparatus for projecting an image of a plate onto a substrate to be exposed through a projection optical system. The apparatus includes a device for measuring an elongation of the plate in accordance with the detection of a reference mark of the projection optical system and a device for controlling a magnification of the projection optical system in accordance with the measured elongation.

12 Claims, 4 Drawing Sheets

PROJECTION EXPOSURE APPARATUS AND METHOD

BACKGROUND OF THE INVENTION

1. Field of the Invention

The present invention relates to a projection exposure apparatus and method, and, more particularly, to an exposure apparatus (being a semiconductor producing apparatus) and method for precisely aligning a plate, such as a mask or reticle, and a substrate to be exposed, such as a semiconductor wafer or the like.

2. Description of the Related Art

Finer and more highly integrated semiconductor integrated circuits, large-scale integrated circuits, and the like have led to the production of more capable semiconductor exposure apparatuses that provide greater precision. There has particularly been a demand for a technique for superimposing a plate and a substrate on the order of a few tens of nanometers during alignment.

Steppers and step-and-scan apparatuses are known as such exposure apparatuses used in the production of semiconductors. They successively transfer a pattern formed on a plurality of locations of a plate (such as a reticle) onto a substrate (such as a semiconductor wafer), while the substrate is being moved in steps. Those which perform the transfer in one operation are called steppers, while those which perform the transfer while scanning the stage are called step-and-scan apparatuses. These two types of apparatuses differ in the manner of operation during exposure, but their basic operations are the same in that transfer is performed in a step-and-repeat fashion. In addition, these two types do not essentially differ in that the position of the entire region of the substrate (global) is previously determined.

In recent years, thermal expansion of the plate (reticle), during alignment of the plate and the substrate by means of a semiconductor exposure apparatus, can no longer be ignored. This problem of thermal expansion can be overcome by making corrections as a result of obtaining the thermal expansion amount from the thermal absorption rate and the exposure amount of the plate. The corrections, however, are strictly based on calculations, producing a large error from the actual expansion amount. The heat absorbed by the plate is dissipated by radiation and convection into the air, which cannot be easily and properly described by a single formula. However, the expansion amount of the plate can only be calculated from an accurate estimation of the heat absorbed by the plate and the heat dissipated from the plate.

SUMMARY OF THE INVENTION

Accordingly, it is an object of the present invention to provide means for measuring the thermal expansion of the plate and making corrections in order to align the plate and the substrate to be exposed with high precision.

To this end, according to one aspect of the present invention, there is provided an exposure apparatus for projecting an image of a plate onto a substrate to be exposed through a projection optical system, which comprises means for measuring an elongation of the plate; and means for controlling a magnification of the projection optical system in accordance with the measured elongation.

The exposure apparatus may further comprise a reference mark fixed to a portion of the projection optical system, which is adjacent to the plate. The measuring means can measure the elongation of the plate with respect to the reference mark.

According to another aspect of the present invention, there is provided an exposure apparatus for projecting an image of a plate onto a substrate to be exposed through a projection optical system, which comprises means for measuring deformation of the plate; and means for controlling a magnification of the projection optical system and a position of the plate relative to a position of the substrate to be exposed in accordance with the measured deformation.

The exposure apparatus may further comprise a reference mark fixed to a portion of the projection optical system, which is adjacent to the plate. The measuring means can measure the deformation of the plate with respect to the reference mark.

In still another aspect of the present invention, there is provided an exposure apparatus for relatively scanning a plate and a substrate to be exposed, while projecting an image of the plate onto the substrate to be exposed through a projection optical system, the apparatus comprising means for measuring deformation of the plate; and means for controlling a magnification of the projection optical system and a relative scanning direction of the plate and the substrate to be exposed.

The exposure apparatus may further comprise a reference mark fixed to a portion of the projection optical system, which is adjacent to the plate. The measuring means can measure the elongation of the plate with respect to the reference mark.

In still another aspect of the present invention, there is provided an exposing method for projecting an image of a plate onto a substrate to be exposed through a projection optical system, which comprises the steps of measuring an elongation of the plate; and controlling a magnification of the projection optical system in accordance with the measured elongation.

The exposing method may further comprise the step of providing a reference mark fixed to a portion of the projection optical system, which is adjacent to the plate. In the measuring step, the elongation of the plate may be measured with respect to the reference mark.

In still another aspect of the present invention, there is provided an exposing method for projecting an image of a plate onto a substrate to be exposed through a projection optical system, which comprises the steps of measuring deformation of the plate; and controlling a magnification of the projection optical system and a position of the plate relative to a position of the substrate to be exposed in accordance with the measured deformation.

The exposing method may further comprise the step of providing a reference mark fixed to a portion of the projection optical system, which is adjacent to the plate. In the measuring step, the deformation of the plate may be measured with respect to the reference mark.

In still another aspect of the present invention, there is provided an exposing method for relatively scanning a plate and a substrate to be exposed, while projecting an image of the plate onto the substrate to be exposed through a projection optical system, the method comprising the steps of measuring deformation of the plate; and controlling a magnification of the projection optical system and a relative scanning direction of the plate and the substrate to be exposed in accordance with the measured deformation.

The exposing method may further comprise the step of providing a reference mark fixed to a portion of the projection optical system, which is adjacent to the plate. In the measuring step, the elongation of the plate may be measured with respect to the reference mark.

DESCRIPTION OF THE PREFERRED EMBODIMENTS

Reference marks are placed directly above or below a plate at two or more thermally stable locations. Plate marks are also placed on the plate. Differences between the locations of the reference marks and the plate marks are determined with an optical means in order to calculate the amount of elongation of the plate from the differences between the two or more locations of the reference marks and the plate marks. The reference marks, the plate marks, and the optical means may each be disposed outwardly relative to the exposure region of the plate. Disposing the marks and optical means in this way allows determinations to be made independently of the exposure in terms of time.

A description will now be given of the preferred embodiments of the present invention, with reference to the drawings.

EMBODIMENT 1

Figure 1A:
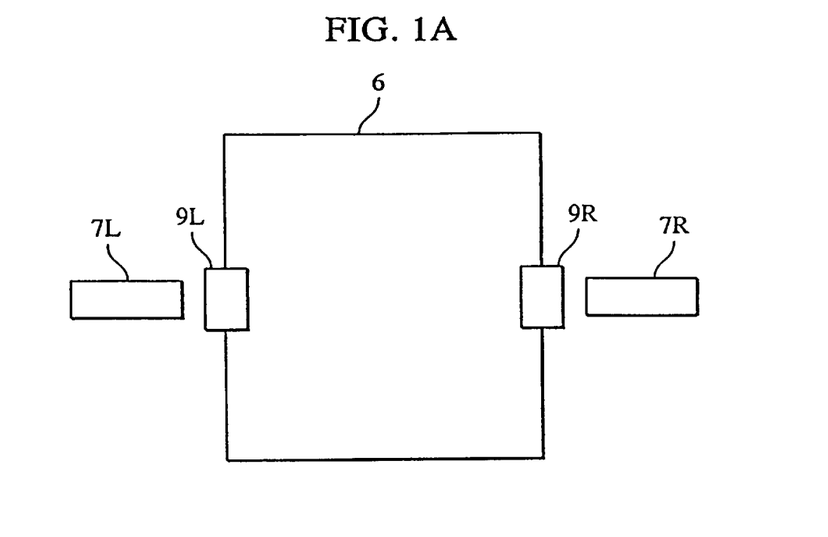
FIG. 1A is a top view of a stepper of Embodiment 1 in accordance with the present invention.
Figure 1B:
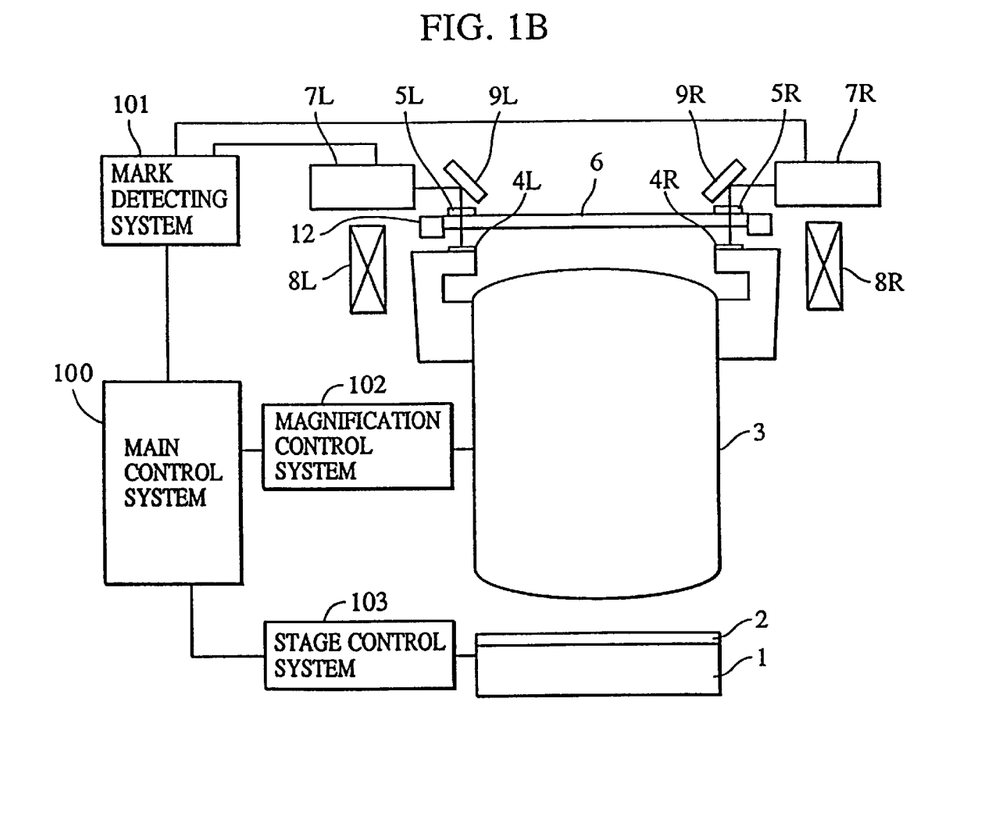
FIG. 1B is a side view of the stepper of Embodiment 1 in accordance with the present invention.

FIGS. 1A and 1B are views showing the structure of a projection exposure apparatus (stepper) of Embodiment 1 in accordance with the present invention, wherein the two marks on the reticle and the two reference marks fixed to the lens barrel are shown as the primary parts in the figure. In addition, these figures show the temperature adjusting system.

In FIG. 1B, reference numeral 1 denotes a movable wafer stage for carrying a wafer; reference numeral 2 denotes a wafer; reference numeral 3 denotes a projection optical system for projecting the pattern of the reticle onto the wafer 2; reference numerals 4L and 4R denote reference marks; reference numerals 5L and 5R denote reticle marks; reference numeral 6 denotes a reticle; reference numeral 12 denotes a movable reticle stage for carrying a reticle; reference numerals 7L and 7R denote measuring scopes for monitoring the reference marks and the reticle marks; reference numerals 8L and 8R denote temperature adjustors; and reference numerals 9L and 9R denote mirrors.

Reference numeral 101 denotes a mark detecting system for determining the location of each mark based on the detection data obtained by the measuring scopes 7L and 7R; reference numeral 102 denotes a magnification control system for controlling the magnification of the projection optical system 3 by displacing at least one of the lenses of the projection optical system in a direction of the optical axis; reference numeral 103 denotes a stage controlling system for controlling the position of the stage; and reference numeral 100 denotes a main control system for controlling the aforementioned mark detecting system 101, the magnification control system 102, and the stage control system 103.

The two reference marks 4R and 4L fixed to the top portion of the projection optical system 3, that is, the portion adjacent to the reticle, and the reticle marks 5L and 5R formed on the reticle are detected with the measuring optical systems 7L and 7R, in order to determine the locations of the reticle marks 5L and 5R relative to the two reference marks 4R and 4L based on the detection data obtained by the measuring scopes 7L and 7R. When the locations of each of the marks on a reference coordinate system are represented by the reference numerals denoting each of the marks, the difference L between the reticle mark 5L and the reference mark 4L, and the difference R between the reticle mark 5R and the reference mark 4R become, respectively:

$$L = 5L - 4L \tag{1}$$

$$R = 5R - 4R \tag{2}$$

where L, R, 4L, 4R, 5L, and 5R are two-dimensional vectors. The locations of the reference marks 4L and 4R are fixed at the projection optical system 3, serving as a reference in the apparatus, and the ambient temperature is controlled by the temperature adjustors 8L and 8R. Therefore, the distance between the reference marks (4L–4R) is constant. Consequently, when the difference between the reticle mark 5L and the reference mark 4L at a particular time is expressed as L(t) and the difference between the reticle mark 5R and the reference mark 4R at a particular time is expressed as R(t), the elongation of the reticle ΔW(t) at a certain time becomes:

$$\Delta W(t) = W(t) - W(0) \tag{3}$$

where $$W(t) = |L(t) - R(t)|/|4L - 4R| \tag{4}$$

The distance between the reticle marks is determined in accordance with wafers. Based on the measured distance, the projection magnification of the projection optical system 3 is corrected with the magnification control system 102 such that the pattern on the reticle is transferred with the desired magnification. During the time between measurements, direct interpolations are performed. When the change in magnification is smaller than a predetermined tolerance, corrections are not made. The tolerance is predetermined, taking into account both the sum of the magnification driving accuracy of the magnification control system 102 and the measurement accuracy of the mark detecting system 101 with regard to a desired accuracy.

Although measurements can be made at any time, since only the reference marks fixed to the projection optical system, the special-purpose measuring optical systems, and the reticle marks, all of which are disposed outwardly relative to the exposure region, are used, it is most desirable to make the measurements during wafer replacement when oscillations of the body are relatively small.

From the measurements, it is possible not only to measure the magnification required with respect to the reticle, but also, at the same time, to determine the position of the reticle with reference to the reference marks and to measure the rotation of the reticle. When the locations of the reference marks are rectified with respect to the wafer stage coordinate system, the position of the reticle with respect to the wafer coordinate system can be monitored at any time. Although the reticle 6 is vacuously adsorbed to the reticle stage, oscillations of the apparatus body, caused by driving of the wafer stage 1, or temperature changes not only change the magnification required in relation to the reticle 6, but also cause parallel shifting and rotation. Thus, more precise alignment can be achieved when the positional and rotational values are reflected in the alignment correction value.

Although in the foregoing description, measurements were carried out in accordance with wafers, they may be performed based on past magnification changes.

EMBODIMENT 2

Figure 2:
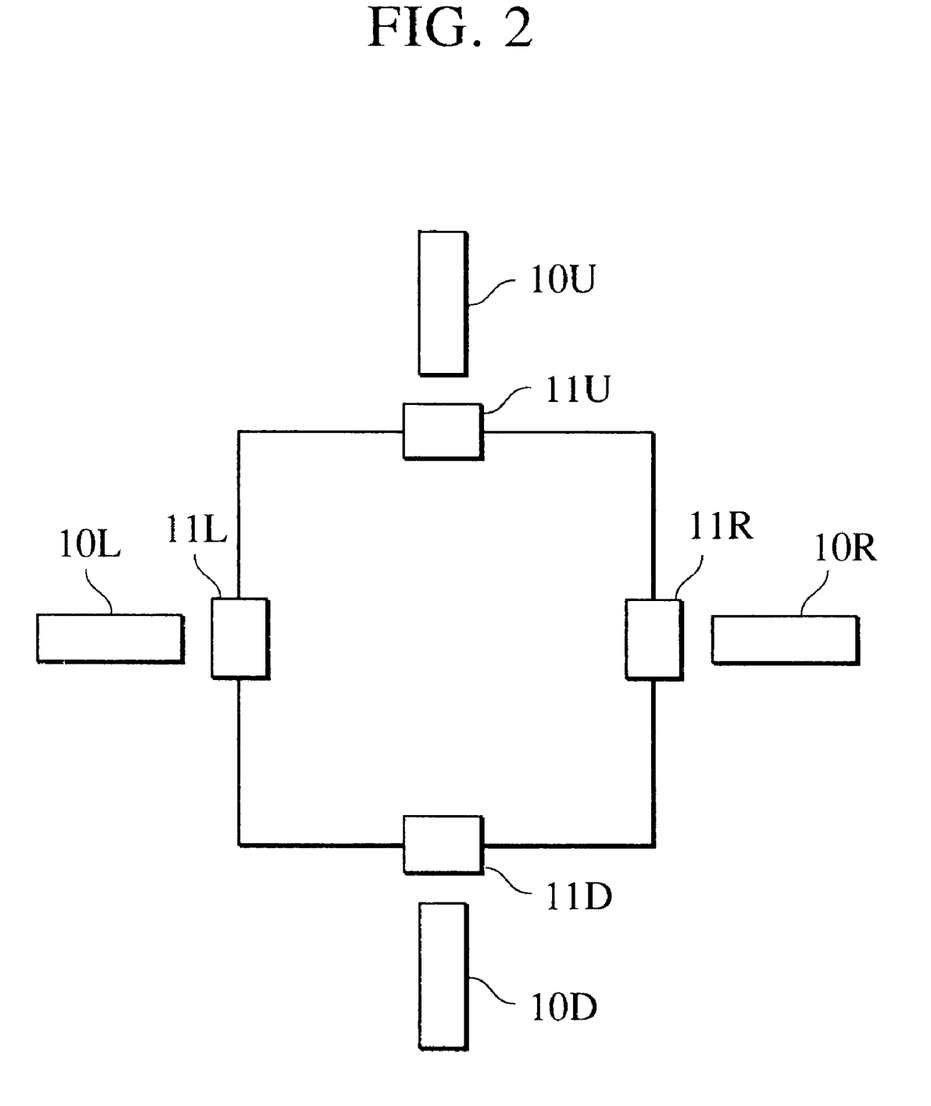
FIG. 2 is a view showing a stepper of Embodiment 2 in accordance with the present invention.

Placing three or more reference marks allows more precise measurements. FIG. 2 shows an example in which four reference marks are placed. The four scopes and mirrors are placed above the reticle. In FIG. 2, reference numerals 10U and 10D denote the measuring scopes disposed in a vertical or Y direction of the reticle 6 (FIG. 1), while reference numerals 10L and 10R denote the measuring scopes disposed in a horizontal or x direction of the reticle 6 (FIG. 1). Reference numerals 11U, 11D, 11L, and 11R denote reference marks fixed to the projection optical system 3 (FIG. 1) and reticle marks formed on the reticle 6. In this case, the following equation is solved using a minimum square approximation formula in order to determine shifts Sx and Sy representing the amount of deformation of the reticle, the magnification B=(Bx+By)/2, and the rotation θ=(θx+θy)/2. Using the obtained shifts Sx and Sy and the rotation θ as correction values for alignment, either the reticle stage or the wafer stage during exposure may be driven. The magnification B is corrected by changing the magnification of the projection optical system.

When the design reticle mark position is $D_i$, the difference between the locations of the reference mark and the reticle mark is $L_i$, and $D_i$ is corrected and changed to $D_i'$, the error $R_i$ in the difference between the locations after correction is $$R_i = (D_i + L_i) - D_i' \quad (5)$$

Each of the corrections is performed such that the average of the sum of the squares of the error $R_i$ is a minimum. That is, corrections are performed such that $$V = 1/n \cdot \Sigma R_i \cdot R_i \quad (5)$$

is a minimum. When each of the correction amounts is expressed as written above, $$D_{i'} = \begin{vmatrix} 1+Bx & -\theta y \\ \theta x & 1+By \end{vmatrix} D_i + \begin{vmatrix} Sx \\ Sy \end{vmatrix} \quad (6)$$

Thus, Formula (5) becomes $$V = 1/n \cdot \Sigma Ri = 1/n \cdot \Sigma |(D_i + L_i) - D_{i'}|^2 \quad (7)$$

$$= 1/n \cdot \Sigma \left| L_i - \begin{vmatrix} Bx & -\theta y \\ \theta x & By \end{vmatrix} \cdot D_i - \begin{vmatrix} Sx \\ Sy \end{vmatrix} \right|^2$$

Sx, Sy, θx, θy, Bx, and By are determined when the formula yields a minimum value. Sx and Sy represent translational components and are used to make corrections and drive the reticle stage or the wafer stage. θ=θx+θy represents the rotational component and is similarly used to make corrections and drive the reticle stage or the wafer stage. B=Bx+By represents the magnification component and is used to change the projection magnification, which is done either by moving part of or the entire projection optical system. It may also be done by increasing or decreasing the gas pressure of the projection optical system or by changing the exposure wavelength.

Although in the above formula, the x and y components of the rotation and the magnification were determined separately, and the average of the x and y values were determined when calculating the correction driving values, they can be determined from the start using θ=θx=θy and B=Bx=By. The correction and driving can be performed as described in Embodiment 1.

EMBODIMENT 3

Figure 3:
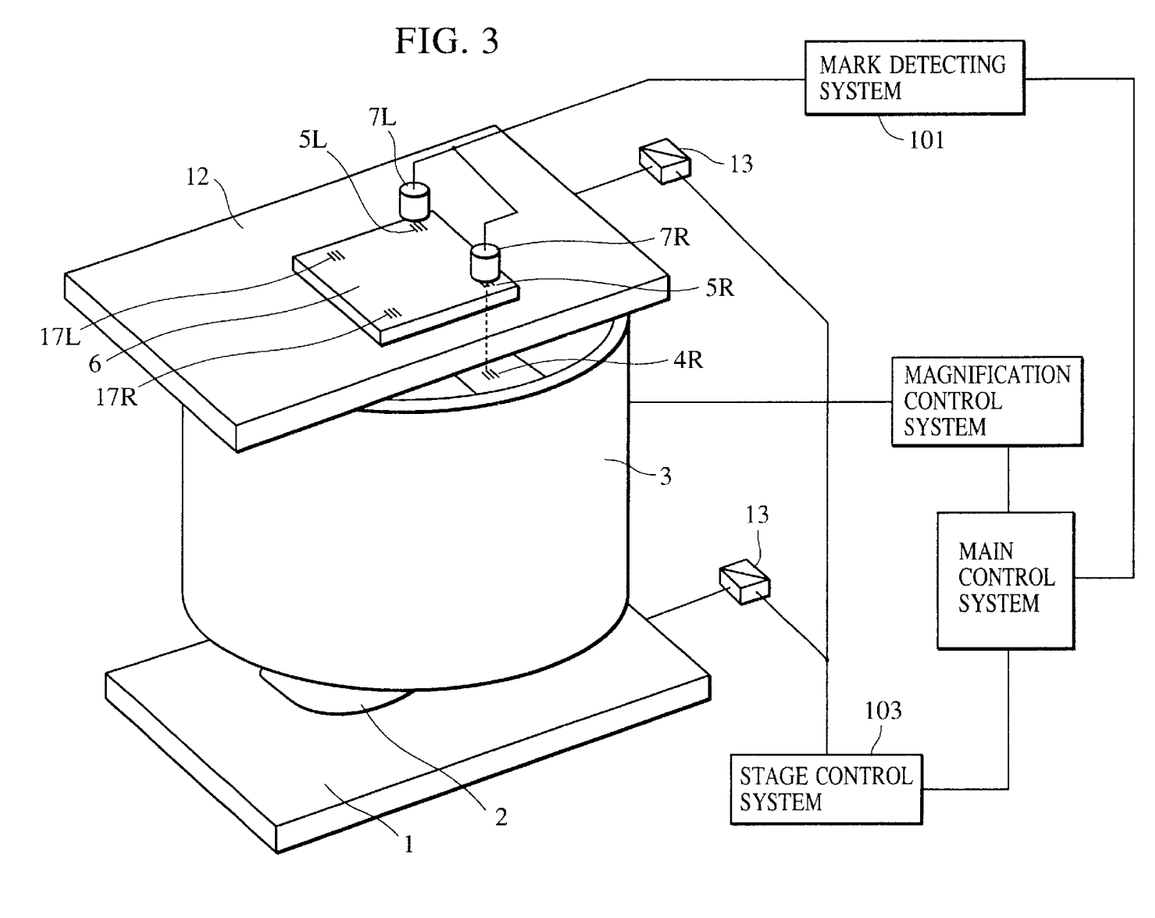
FIG. 3 is a view showing a step-and-scan type exposure apparatus in Embodiment 3 in accordance with the present invention.

FIG. 3 is a view showing a step-and-scan type exposure apparatus of Embodiment 3 in accordance with the present invention. Two measuring scopes are placed above the reticle stage in order to determine the differences in locations with respect to the two reference marks fixed to the lens barrel of the projection optical system. Driving the reticle stage permits four or more points to be measured, even though there are only two scopes.

More specifically, as shown in FIG. 3, for a step-and-scan apparatus, when the reference marks 4L and 4R, the reticle marks 5L and 5R, and the special-purpose scopes 7L and 7R are provided, the elongation of the reticle 6 can be measured while the arrangement is stationary, as with Embodiment 1. Taking advantage of the characteristics of the reticle scan apparatus and driving the reticle stage 12 makes it possible to determine the differences between the locations of the plurality of reticle marks 5L, 5R, 17L, and 17R with respect to the reference mark 4L and 4R. In this case, the amount of elongation of the reticle 6 is measured with reference to an interferometer 13 of the reticle stage. In FIG. 3, corresponding component parts to those of FIG. 1 are given the same reference numerals.

In the example of FIG. 3, two special-purpose scopes 7L and 7R are disposed in a direction perpendicular to the scanning direction, and the magnification required with respect to the reticle is obtained from the differences between the locations of the reference marks 4R and 4L (fixed to the lens barrel of the projection lens) with respect to the reticle marks 5R and 5L. In the scanning direction, the differences between the locations of the reference marks 4R and 4L and the reticle marks 17L and 17R, respectively, are measured by using the scopes 7L and 7R and driving the reticle stage 12. The reticle marks 5L and 17L, and the reticle marks 5R and 17R are located in a driving direction of the reticle stage. The magnification required with respect to the reticle in the driving direction is obtained from the amount of driving of the reticle stage 12 (read value of the interferometer) and the difference between the locations of the reticle mark 17L and the reticle mark 5L. Here, the difference between the locations of the reticle mark 17R and the reticle mark 5R is also determined in order to increase the accuracy using the average value of both.

In a scan system, the two magnifications, that is, the magnification in the scanning direction and the magnification in the direction perpendicular to the scanning direction, can be corrected. More specifically, the magnification in the direction perpendicular to the scanning direction is corrected by changing the magnification of the projection optical system. The magnification in the scanning direction is corrected by changing the ratio of the reticle scanning speed to the wafer scanning speed. If it is assumed that the reticle is elongated isometrically, the average of the magnification in the scanning direction and the magnification in the direction perpendicular to the scanning direction can also be used. Accordingly, determining the differences in locations with respect to two different references not only promises increased accuracy in measurements due to reduced deviations, but also allows an abnormal value produced when one of the references is mechanically displaced to be known.

EMBODIMENT 4

Figure 4:
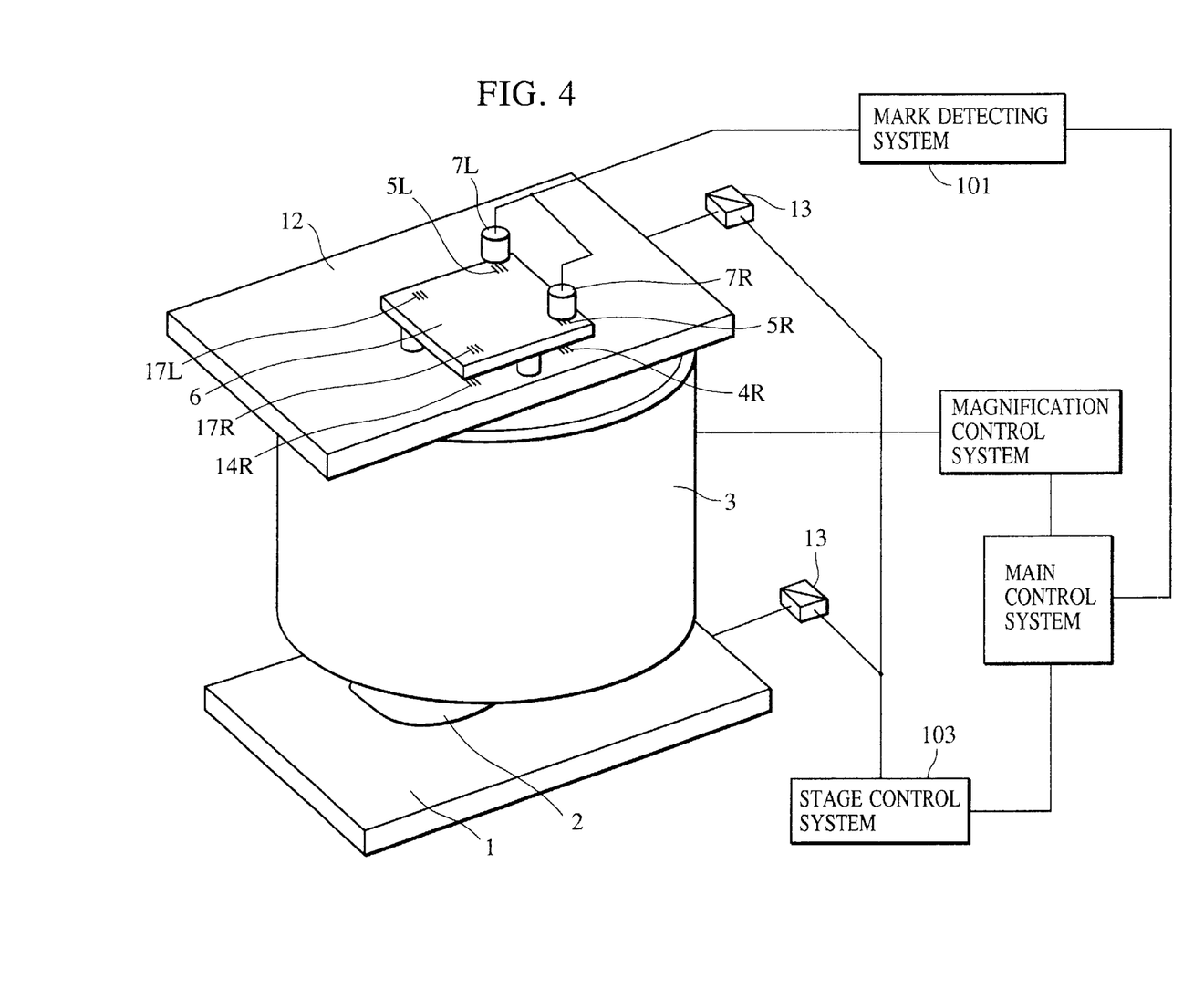
FIG. 4 is a view showing a step-and-scan type exposure apparatus in Embodiment 4 in accordance with the present invention.

FIG. 4 is a view showing a step-and-scan exposure apparatus of Embodiment 4 in accordance with the present invention. In the apparatus of FIG. 4, the reference marks are located on the reticle stage 12, thereby eliminating the need for fixing the reference marks to the lens barrel and thus, making it easier to provide space around the reticle stage.

In this way, when a step-and-scan apparatus is used, the magnification can be measured even when reference marks are located on the reticle stage 12, as shown in FIG. 4. In FIG. 4, the marks 5L, 5R, 17L, and 17R are placed at four locations on the reticle 6, and the reference marks 4L, 4R, 14L, and 14R are placed on the reticle stage 12 at locations corresponding to the locations of the marks 5L, 5R, 17L, and 17R. The measuring scopes are disposed at two locations. In this case, measurements are made by moving the reticle stage 12 directly under the scopes 7L and 7R. The measured value can be used not only to determine the magnification of the reticle, but also, at the same time, to determine the position of the reticle based on the measurements of the reticle stage interferometer.

The invention may be embodied in other specific forms without departing from the spirit or essential characteristics thereof. The present embodiments are therefore to be considered in all respects as illustrative and not restrictive, the scope of the invention being indicated by the appended claims rather than the foregoing description and all changes which come within the meaning and range of equivalency of the claims are therefore intended to be embraced therein.

What is claimed is:

1. An exposure apparatus for projecting an image of a plate onto a substrate to be exposed through a projection optical system, said apparatus comprising:
    means for detecting locations of first and second marks on the plate relative to first and second reference marks fixed on a side plate of the projection optical system, without performing the detection through the projection optical system;
    means for determining an elongation of the plate in accordance with the detection of the differences in positions of the marks on the plate and the reference marks on the plate side of the projection optical system in relation to a difference in positions of the reference marks of the projection optical system; and
    means for controlling a magnification of the projection optical system in accordance with the determined elongation.

2. An exposure apparatus according to claim 1, wherein the reference marks are fixed to a portion of the projection optical system, which is adjacent to the plate.

3. An exposure apparatus for projecting an image of a plate onto a substrate to be exposed through a projection optical system, said apparatus comprising:
    means for detecting locations of first and second marks on the plate relative to first and second reference marks fixed on a side plate of the projection optical system, without performing the detection through the projection optical system;
    means for determining deformation of the plate in accordance with the detection of the differences in positions of the marks on the plate and the reference marks in relation to a difference in positions of the reference marks of the projection optical system; and
    means for controlling a magnification of the projection optical system and a position of the plate relative to a position of the substrate to be exposed in accordance with the determined deformation.

4. An exposure apparatus according to claim 3, wherein the reference marks are fixed to a portion of the projection optical system, which is adjacent to the plate.

5. An exposure apparatus for relatively scanning a plate and a substrate to be exposed, while projecting an image of the plate onto the substrate to be exposed through a projection optical system, said apparatus comprising:
    means for detecting locations of first and second marks on the plate relative to first and second reference marks fixed on a side plate of the projection optical system, without performing the detection through the projection optical system;
    means for determining deformation of the plate in accordance with the detection of the differences in positions of the marks on the plate and the positions of the reference marks in relation to the difference in positions of the reference marks of the projection optical system; and
    means for controlling a magnification of the projection optical system and a relative scanning direction of the plate and the substrate to be exposed in accordance with the determined deformation.

6. An exposure apparatus according to claim 5, wherein the reference marks are fixed to a portion of the projection optical system, which is adjacent to the plate.

7. An exposing method for projecting an image of a plate onto a substrate to be exposed through a projection optical system, said method comprising the steps of:
    detecting locations of first and second marks on the plate relative to first and second reference marks fixed on a side plate of the projection optical system, without performing the detection through the projection optical system;
    determining an elongation of the plate in accordance with the detection of the differences in positions of the marks on the plate and the positions of the reference marks in relation to a difference in positions of the reference marks of the projection optical system; and
    controlling a magnification of the projection optical system in accordance with the determined elongation.

8. An exposing method according to claim 7, wherein the reference marks are fixed to a portion of the projection optical system, which is adjacent to the plate.

9. An exposing method for projecting an image of a plate onto a substrate to be exposed through a projection optical system, said method comprising the steps of:
    detecting locations of first and second marks on the plate relative to first and second reference marks fixed on a side plate of the projection optical system, without performing the detection through the projection optical system;
    determining deformation of the plate in accordance with the detection of the differences in positions of the marks on the plate and the reference marks in relation to a difference in positions of the reference marks of the projection optical system; and
    controlling a magnification of the projection optical system and a position of the plate relative to a position of the substrate to be exposed in accordance with the determined deformation.

10. An exposing method according to claim 9, wherein the reference marks are fixed to a portion of the projection optical system, which is adjacent to the plate.

11. An exposing method for relatively scanning a plate and a substrate to be exposed, while projecting an image of the plate onto the substrate to be exposed through a projection optical system, said method comprising the steps of:

detecting locations of first and second marks on the plate relative to first and second reference marks fixed on a side plate of the projection optical system, without performing the detection through the projection optical system;

determining deformation of the plate in accordance with the detection of the differences in positions of the marks on the plate and the reference marks in relation to a difference in positions of the reference marks of the projection optical system; and controlling a magnification of the projection optical system and a relative scanning direction of the plate and the substrate to be exposed in accordance with the determined deformation.

12. An exposing method according to claim 11, wherein the reference marks are fixed to a portion of the projection optical system, which is adjacent to the plate.

* * * * *

UNITED STATES PATENT AND TRADEMARK OFFICE
CERTIFICATE OF CORRECTION

PATENT NO. : 6,271,910 B1
DATED : August 7, 2001
INVENTOR(S) : Shigeyuki Uzawa

Page 1 of 1

It is certified that error appears in the above-identified patent and that said Letters Patent is hereby corrected as shown below:

Column 7,
Lines 44 and 65, "side plate" should read -- plate side --.

Column 8,
Lines 18, 39 and 58, "side plate" should read -- plate side --.

Column 9,
Line 12, "side plate" should read -- plate side --.

Signed and Sealed this

Thirtieth Day of April, 2002

Attest:

JAMES E. ROGAN
Attesting Officer    Director of the United States Patent and Trademark Office